United States Patent
Kuypers

(10) Patent No.: US 9,236,211 B2
(45) Date of Patent: Jan. 12, 2016

(54) ELECTRODE FOR DIELECTRIC BARRIER DISCHARGE TREATMENT OF A SUBSTRATE

(71) Applicant: OCE-TECHNOLOGIES B.V., Venlo (NL)

(72) Inventor: Herman Kuypers, Velden (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 14/521,873

(22) Filed: Oct. 23, 2014

(65) Prior Publication Data

US 2015/0115791 A1    Apr. 30, 2015

(30) Foreign Application Priority Data

Oct. 24, 2013  (EP) .................................. 13190096

(51) Int. Cl.
| | |
|---|---|
| *H01J 1/02* | (2006.01) |
| *H01J 7/24* | (2006.01) |
| *H01J 61/52* | (2006.01) |
| *H01K 1/26* | (2006.01) |
| *H01T 19/00* | (2006.01) |
| *H01J 37/32* | (2006.01) |

(52) U.S. Cl.
CPC . *H01J 1/025* (2013.01); *H01J 7/24* (2013.01); *H01J 37/32596* (2013.01); *H01T 19/00* (2013.01)

(58) Field of Classification Search
CPC ....... H01J 1/025; H01J 37/32596; H01J 7/24; H01J 2237/327; H01J 37/32348; H01L 21/477; H01L 21/0234; H05H 2001/2412; H05H 1/2406; B01J 19/088; B01J 19/126; B01J 20/14; B01J 20/20; B01J 20/2803; B01J 20/28042; B01J 2219/0809; B01J 2219/0815; B01J 2219/0894; H01T 19/00
USPC .................................................... 313/30, 356
See application file for complete search history.

(56) References Cited

U.S. PATENT DOCUMENTS

| | | | | |
|---|---|---|---|---|
| 4,841,409 | A * | 6/1989 | Kalwar .......................... | 361/230 |
| 5,401,368 | A * | 3/1995 | Ford et al. ..................... | 204/164 |
| 6,424,091 | B1 * | 7/2002 | Sawada et al. ............. | 315/111.81 |
| 6,785,113 | B1 * | 8/2004 | Pham ............................. | 361/230 |
| 7,462,379 | B2 * | 12/2008 | Fukuda et al. ................ | 427/569 |
| 2003/0113479 | A1 * | 6/2003 | Fukuda et al. ................ | 427/569 |
| 2003/0228416 | A1 * | 12/2003 | Iwamaru ....................... | 427/200 |

FOREIGN PATENT DOCUMENTS

| | | |
|---|---|---|
| EP | 0621667 A2 | 10/1994 |
| EP | 1919048 A1 | 5/2008 |

* cited by examiner

*Primary Examiner* — Anne Hines
*Assistant Examiner* — Jose M Diaz
(74) *Attorney, Agent, or Firm* — Birch, Stewart, Kolasch & Birch, LLP

(57) ABSTRACT

An electrode for dielectric barrier discharge treatment of a substrate includes a tubular housing that is made of electrically insulating material and has a bottom wall facing the substrate, two side walls extending away from the substrate, and a top wall connecting the distal ends of the side walls. The electrode further includes an electrically conductive electrode member disposed inside the housing and having a plate that engages an internal surface of the bottom wall of the housing. The electrode has two wings formed in one piece with the plate and engaging internal surfaces of the side walls of the housing.

9 Claims, 2 Drawing Sheets

ELECTRODE FOR DIELECTRIC BARRIER DISCHARGE TREATMENT OF A SUBSTRATE

CROSS-REFERENCE TO RELATED APPLICATIONS

This application claims priority under 35 U.S.C. §119(a) to Application No. 13190096.1, filed in Europe on Oct. 24, 2013, the entirety of which is expressly incorporated herein by reference.

BACKGROUND OF THE INVENTION

1. Field of the Invention

The present invention relates to an electrode for dielectric barrier discharge treatment of a substrate, the electrode comprising a tubular housing that is made of electrically insulating material and having a bottom wall facing the substrate, two side walls extending away from the substrate, and a top wall connecting the distal ends of the side walls. The electrode further comprises an electrically conductive electrode member disposed inside the housing and having a plate that engages an internal surface of the bottom wall of the housing and two wings formed in one piece with the plate and engaging internal surfaces of the side walls of the housing.

2. Background of the Invention

A dielectric barrier discharge treatment such as a plasma treatment or corona treatment is frequently employed for modifying the surface tension of a substrate in order to improve, for example, the adhesion of a coating layer, an ink layer or the like that is to be applied to the surface of the substrate.

EP 0 621 667 A2 shows an electrode of the type mentioned above, wherein the electrode member is tubular and water cooled, and the housing is formed by a ceramic coating on the electrode member.

EP 1 919 048 A1 discloses a corona electrode, wherein the housing is made of ceramic material and the electrode is configured as a flat plate that engages the bottom wall of the housing and extends between the opposite side walls of the housing.

When an electrode having this design is to be employed for plasma treatment, a high voltage with high frequency is applied to the electrode member, thereby creating an oscillating electric field that excites a gaseous medium (ambient air or a suitable treatment gas) that is present in the space between the electrode and the surface of the substrate to be treated, so that the gaseous medium is turned into a plasma. In the process of generating the plasma, a considerable amount of heat is generated inside the electrode plate. It is thereby necessary to cool the electrode in order to prevent the ceramic housing from being over-heated.

In order to control the temperature of the electrode, it is possible to circulate a cooling medium, e.g. air, through the tubular housing.

SUMMARY OF THE INVENTION

It is an object of the present invention to provide am improved electrode design that is particularly suited for plasma treatment.

According to the present invention, the electrode member is formed separately from the housing and is thrust into the internal cross-section of the housing so as to be immobilized within the housing by the wings of the electrode member that engage the side walls of the housing.

With this design, a cooling medium may be passed through the housing. Then, the two wings serve as additional cooling fins that improve the cooling effect by thermal contact with the cooling medium. Moreover, the two wings engaging the side walls of the housing provide convenient means for reliably securing the electrode member within the housing, which has the additional advantage that no insulating glue or air layer is needed between the bottom of the housing and the electrode. In particular, when the electrode member is somewhat clamped between the side walls of the housing, due to thermal expansion of the electrode member or due to dimensional tolerances of the housing, the wings will distribute the forces acting upon the side walls of the housing over a larger area and will prevent the housing from being damaged. Moreover, it is possible to manufacture the electrode simply by thrusting the electrode member into the tubular housing.

The two wings may be biased outwardly, so that they engage the side walls of the housing with a slight pressure for reliably securing the electrode member within the housing.

In an embodiment, the height of the wings substantially equals the height of the side walls, the height of the side walls being defined as the distance between the inner bottom wall and the start of the inner curvature of the inner side walls towards the inner top wall. Thus, the electrode member is also held in position in the housing in the direction normal to the bottom wall.

The electrode member according to the present embodiment tightly fits into the housing. When heated and due to thermal expansion differences between the electrode member and the housing, the upper parts of the electrode member are pushed inwards by the curvature of the inner corners defining the transition between the inner side walls and the inner top wall of the housing.

Optionally, the profile of the electrode member may be designed to provide additional cooling fins that project inwardly into the interior of the housing from the plate and/or the wings of the electrode member.

Moreover, the electrode member may comprise flanges that are angled from the distal ends of the wings and engage the internal surface of the top wall of the housing, ensuring that the electrode plate is reliably held in engagement with the bottom wall of the housing. At the same time, these flanges will further enhance the cooling effect.

An embodiment of the present invention is directed to an electrode for dielectric barrier discharge treatment of a substrate. The electrode comprises a tubular housing made of electrically insulating material and having a bottom wall facing the substrate, two side walls extending away from the substrate, and a top wall connecting the distal ends of the side walls. The electrode further comprises an electrically conductive electrode member disposed inside the housing and having a plate that engages an internal surface of the bottom wall of the housing and two wings formed in one piece with the plate and engaging internal surfaces of the side walls of the housing. The electrode member is formed separately from the housing and is thrust into the internal cross-section of the housing so as to be immobilized within the housing by the wings which engage the side walls of the housing.

In an embodiment, the housing is made of ceramics.

In an embodiment, the electrode member is made of copper or a copper alloy.

In an embodiment, the housing has a rectangular internal cross-section.

In an embodiment, the plate and the wings of the electrode member form a U-shaped cross-section.

In an embodiment, the wings are biased outwardly against the side walls of the housing.

In an embodiment, the electrode comprises additional cooling fins that project inwardly from the plate and/or the wings of the electrode member.

In an embodiment, the wings extend over the entire width of the side walls from the bottom wall to the top wall.

In an embodiment, the electrode member comprises flanges that are bent from the distal ends of the wings and engage the top wall of the housing.

In an embodiment, the flanges are biased against the top wall of the housing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
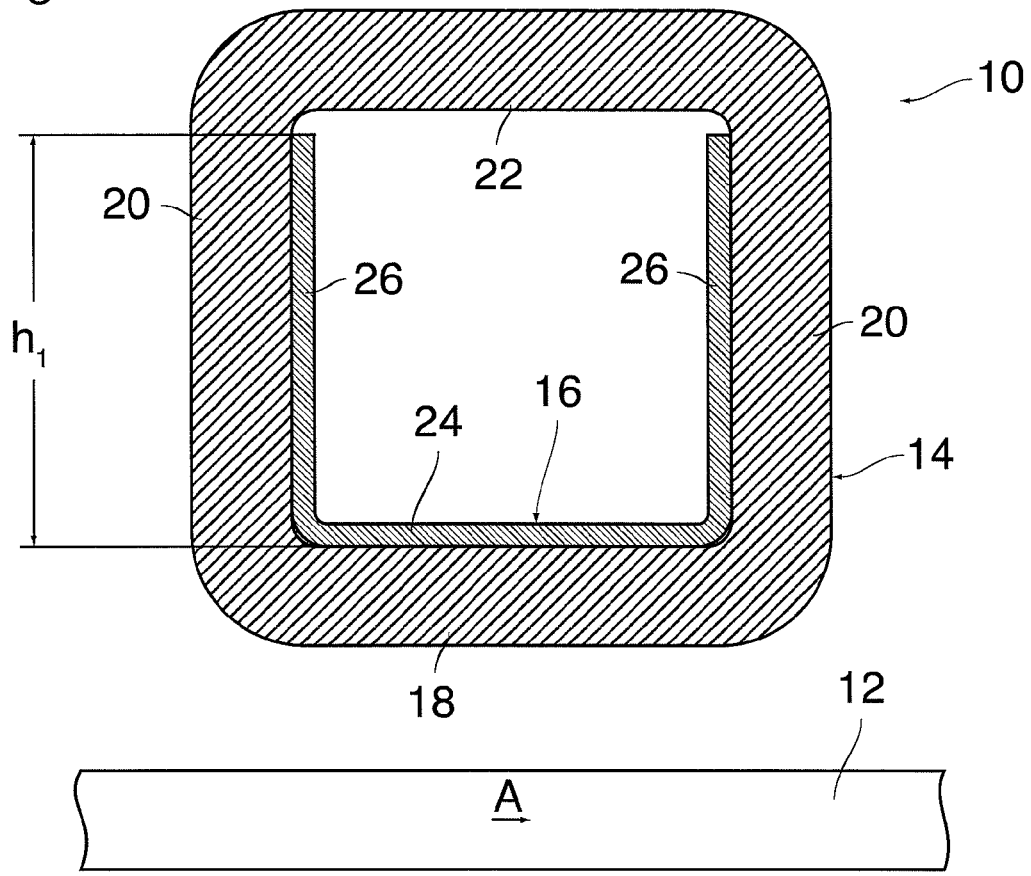
FIG. 1 is a cross-sectional view of an electrode according to one embodiment of the invention.

The present invention will now be described with reference to the accompanying drawings, wherein the same or similar elements are identified with the same reference numeral.

As is shown in FIG. 1, an electrode 10 for plasma treatment of a substrate 12 comprises a tubular housing 14 that is made of an electrically insulating material, preferably ceramics. An electrode member 16 is made of electrically conductive material, preferably copper or another metal with high electric conductivity. The electrode member is disposed inside the housing 14.

In the example shown, the housing 14 has a square cross-section and comprises a flat bottom wall 18, two side walls 20 extending at right angles from opposite ends of the bottom wall 18 and away from the substrate 12, and a top wall 22 that interconnects the distal ends of the side walls 20. The external edges of the housing, where the bottom wall joins the side walls 20 and the side walls 20 join the top wall 22 are preferably rounded-off In the example shown in FIG. 1, the electrode member 16 has a U-shaped profile, comprising a flat plate 24 that engages the internal surface of the bottom wall 18 of the housing, and two wings 26 that extend at right angles from the opposite ends of the plate 24 and engage the internal surfaces of the side walls 20 of the housing and extend over approximately the entire height of the side walls 20 from the bottom wall 18 to the top wall 22. More precisely, in this example, the height ($h_1$) of the wings 26 is substantially equal to the height of the inner side walls, defined as the distance between the inner bottom wall and the start of the inner curvature of the inner side walls towards the inner top wall (also indicated by $h_1$).

In a plasma treatment process, a high voltage with a high frequency of several kHz is applied to the electrode member 16, and the substrate 12 is moved past the electrode 10 in a direction transverse to the longitudinal direction of the electrode, as indicated by an arrow A in FIG. 1. The voltage applied to the electrode member 16 creates an oscillating electric field in the vicinity of the electrode 10, so that a gaseous medium, e.g. ambient air that is present in the space between the bottom wall 18 of the housing and the top surface of the substrate 12 is excited and turned into a plasma. As a result, the top surface of the substrate 12 is subjected to a plasma treatment resulting in a reduced surface tension of the substrate, which is favorable for improving the adhesion of a coating layer or ink layer that is to be applied to the surface of the substrate 12 in a subsequent coating or print process.

However, the high frequency voltage applied to the electrode member 16 also has the effect that the electrode member, especially the plate 24 that interacts with the dielectric material of the substrate 12 is heated. For this reason, in order to prevent an excessive heating of the ceramic material of the bottom wall 18 of the housing and an excessive thermal expansion of the plate 24, a cooling medium, e.g. ambient air, is circulated through the tubular housing.

Since the wings 26 of the electrode member 16 are formed in one piece with the plate 24 and, consequently, consist also of a metal having a high electric conductivity and also a high thermal conductivity, a considerable part of the heat that is generated in the plate 24 is dissipated into the wings 26 by thermal conduction. Moreover, the wings 26 increase the surface of the electrode member 16 that is in thermal contact with the cooling medium flowing through the housing 14 (in the present example, the surface area is increased approximately by a factor of 3), so that heat is efficiently transferred onto the cooling medium. As a consequence, the cooling effect is greatly improved and the ceramic material of the housing 14 is protected against thermal damage. Likewise, the increase in the temperature of the electrode member 16 is limited, also resulting in a limited thermal expansion of this electrode member and thereby reducing the risk that the walls of the tubular casing are broken, all the more since the wings 26 help to distribute the forces that act between the electrode member 16 and the side walls 20 of the housing over a larger surface area.

The electrode 10 shown in FIG. 1 may be manufactured simply by thrusting the U-shaped profile of the electrode member 16 into the internal cross-section of the housing 14, so that the electrode member will be immobilized within the housing by the wings 26 which engage the side walls 20 of the housing. Thus, no additional securing means such as an adhesive are necessary.

Figure 2:
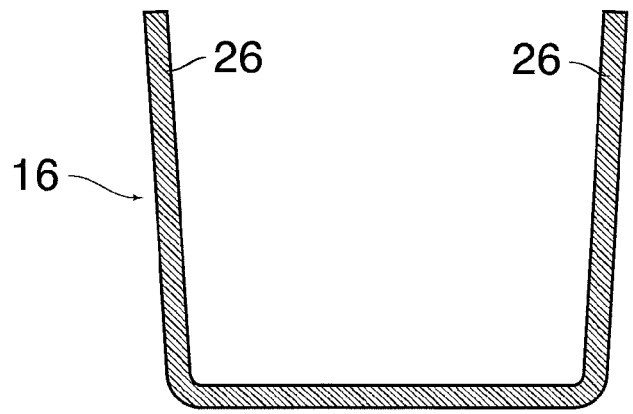
FIG. 2 is a cross-section of an electrode member of the electrode shown in FIG. 1 in a natural state.

Preferably, the wings 26 are slightly biased outwardly so that the electrode member 16 in the natural state, i.e. when not surrounded by the housing 14, assumes the cross-sectional shape shown in FIG. 2, with the wings 26 slightly diverging upwardly. Of course, the wings 26 may be bent into the configuration shown in FIG. 1 in order to insert the electrode member 16 into the housing 14.

Figure 3:
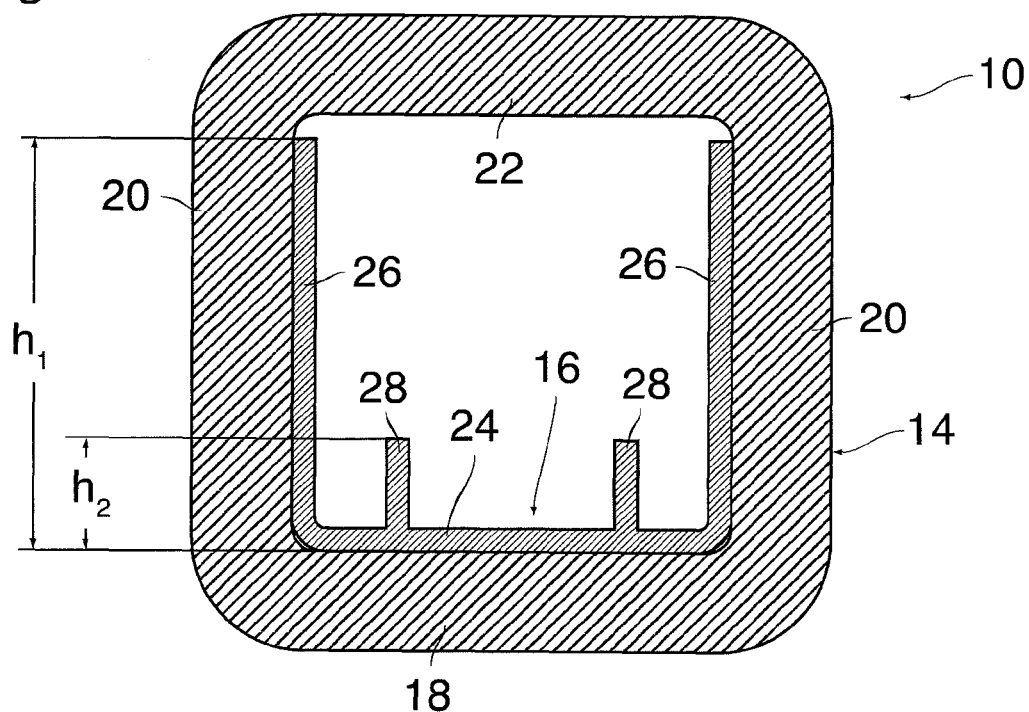
FIG. 3 is a cross-sectional view of an electrode according to a modified embodiment of the invention.

FIG. 3 illustrates a modified embodiment in which the electrode member 16 has additional cooling fins 28 that project inwardly into the interior of the housing 14 in which the cooling medium is circulated. In this example, the additional cooling fins 28 project upwardly from the plate 24. Optionally, the cooling fins or additional cooling fins may be provided to project inwardly from the wings 26. Optionally the height $h_2$ of the cooling fins 28 may be substantially equal to the height $h_1$ of the wings 26, or selected such that the cooling fins 28 engage the internal surface of the top wall 22.

Figure 4:
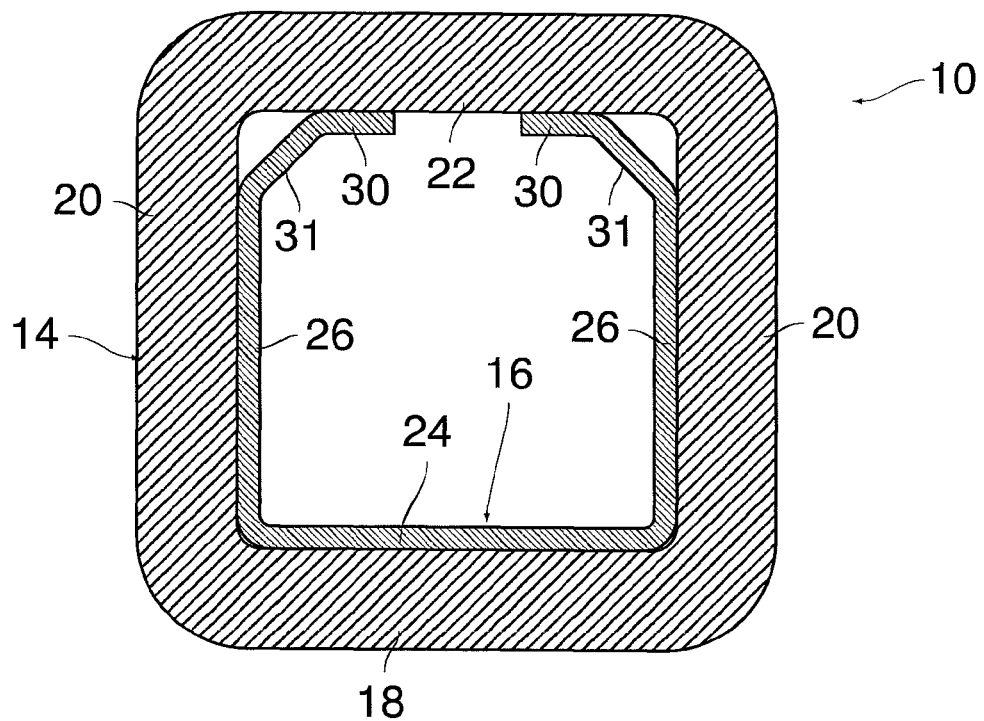
FIG. 4 is a cross-sectional view of jet another embodiment of the invention.

FIG. 4 illustrates an embodiment in which the electrode member 16 has flanges 30 that are bent from the distal ends of the wings 26 and engage the top wall 22 of the housing. Preferably, the flanges 30 are connected to the wings 26 via a portion 31 of the electrode member 16. The portion 31 of the electrode member 16 is preferably not in direct contact with the side walls 20 and the top wall 22 of the housing 14. An advantage of this embodiment is that upon heating of the electrode (e.g. during operation), the electrode member 16 can deform to prevent excessive stresses exerted by the electrode member 16 onto the housing, which stresses (caused by thermal expansion differences between the housing 14 and the electrode member 16) might otherwise damage the electrode. Another advantage of the present embodiment is that the portion 31 of the electrode member contributes twice to the heat exchanging surface.

The flanges 30 also act as additional cooling fins enlarging the contact area between the electrode member 16 and the cooling medium. Further, these flanges 30 secure the electrode member 16 in a position in which the plate 24 is held in engagement with the bottom wall 18 of the housing. Optionally, the flanges 30 may be biased upwardly so that the plate 24 is gently pressed against the bottom wall 18 of the housing.

It is also preferable that the free ends of the flanges 30 are separated from each other by a certain gap, as is shown in FIG. 4, so that the wings 26 may yield inwardly in order to compensate dimensional tolerances of the internal cross-section of the tubular housing 14.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrode for dielectric barrier discharge treatment of a substrate, the electrode comprising:

a tubular housing made of electrically insulating material, said tubular housing having a bottom wall facing the substrate, two side walls extending away from the substrate, and a top wall connecting distal ends of the side walls; and an electrically conductive electrode member disposed inside the housing, said electrically conductive electrode member having a plate engaging an internal surface of the bottom wall of the housing, and two wings formed in one piece with the plate and engaging internal surfaces of the side walls of the housing, wherein the electrically conductive electrode member has a U-shaped cross-section formed by the plate and two wings.

2. The electrode according to claim 1, wherein the housing is made of ceramics.

3. The electrode according to claim 1, wherein the electrically conductive electrode member is made of copper or a copper alloy.

4. The electrode according to claim 1, wherein the housing has a rectangular internal cross-section.

5. The electrode according to claim 1, wherein the two wings are biased outwardly against the side walls of the housing.

6. The electrode according to claim 1, wherein said electrically conductive electrode member further comprises additional cooling fins projecting inwardly from the plate and/or at least one of the two wings of the electrode member.

7. The electrode according to claim 1, wherein the two wings extend over an entire width of the side walls of the housing from the bottom wall to the top wall.

8. The electrode according to claim 1, wherein the electrically conductive electrode member further comprises flanges bent from distal ends of the two wings and engaging the top wall of the housing.

9. The electrode according to claim 8, wherein the flanges are biased against the top wall of the housing.

* * * * *